United States Patent [19]
Blish, II

[11] Patent Number: 5,397,746
[45] Date of Patent: Mar. 14, 1995

[54] QUAD FLAT PACKAGE HEAT SLUG COMPOSITION

[75] Inventor: Richard C. Blish, II, Scottsdale, Ariz.

[73] Assignee: Intel Corporation, Santa Clara, Calif.

[21] Appl. No.: 147,144

[22] Filed: Nov. 3, 1993

[51] Int. Cl.⁶ .............................................. H01L 21/60
[52] U.S. Cl. ..................... 437/209; 437/211; 437/214; 437/217; 437/218; 437/219
[58] Field of Search ............... 437/209, 211, 214, 215, 437/217, 219, 220; 257/717, 720

[56] References Cited

U.S. PATENT DOCUMENTS

| | | | |
|---|---|---|---|
| 4,965,659 | 10/1990 | Sasame et al. | 257/720 |
| 4,994,411 | 2/1991 | Naito et al. | 437/219 |
| 5,081,067 | 1/9992 | Shimizu et al. | 437/215 |
| 5,202,288 | 4/1993 | Doering et al. | 437/217 |
| 5,216,283 | 6/1993 | Lin | 257/717 |
| 5,227,662 | 7/1993 | Ohno et al. | 257/676 |
| 5,304,843 | 4/1994 | Takubo et al. | 437/217 |

Primary Examiner—Brian E. Hearn
Assistant Examiner—Kevin M. Picardat
Attorney, Agent, or Firm—Blakely, Sokoloff, Taylor & Zafman

[57] ABSTRACT

An integrated circuit package which contains a heat slug that extends from an integrated circuit to a top surface of a surrounding housing. The heat slug has a coefficient of thermal expansion that matches the coefficients of thermal expansion of the housing and the integrated circuit to reduce thermal stresses in the package.

2 Claims, 1 Drawing Sheet

QUAD FLAT PACKAGE HEAT SLUG COMPOSITION

BACKGROUND OF THE INVENTION

1. Field of the Invention

The present invention relates to an integrated circuit package.

2. Description of Related Art

Integrated circuits (ICs) are typically housed within a package that can be mounted to a printed circuit board. A conventional IC package includes an outer housing that encapsulates the integrated circuit and a lead frame that couples the circuit to the printed circuit board. The outer housing is typically constructed from a dielectric material such as a glass filled epoxy. Glass filled epoxies have a relatively low coefficient of thermal conductivity. Consequentially heat is dissipated poorly to the ambient and a substantial portion of the heat generated by the integrated circuit is transferred to the printed circuit board through the lead frame. The leads of the lead frame have a large thermal resistance which may cause excessive junction temperatures in the IC. High junction temperatures may damage or otherwise affect the performance and reliability of the circuit.

To improve thermal efficiency, some package designs employ a heat slug that is coupled to the integrated circuit and provides an alternate heat path. The heat slug is typically mounted to the integrated circuit and provides a direct thermal path between the IC and the housing. To assemble such a package, the heat slug is initially coupled to the integrated circuit and encapsulated by an uncured silica filled epoxy. The epoxy is then heated and cured to create a rugged outer housing.

Heat slugs are typically constructed from a thermally conductive material such as copper or aluminum. Copper and aluminum have coefficients of thermal expansion that are higher than the silicon integrated circuit and the glass filled epoxy. Thus when the IC, epoxy and heat slug are heated and then cooled, the higher expansion coefficient of the heat slug can warp or bend the cured outer housing. A warped housing makes it difficult to apply a finned heat sink to the package and therefore increases the cost of the product. A warped housing may also create interference when the package is surface mounted to a printed circuit board. It would therefore be desirable to have an integrated circuit package that is thermally efficient and is easy manufacture.

SUMMARY OF THE INVENTION

The present invention is an integrated circuit package which contains a heat slug that extends from an integrated circuit to a top surface of a surrounding housing. The heat slug has a coefficient of thermal expansion that matches the coefficients of thermal expansion of the housing and the integrated circuit. The extension of the heat slug to the top surface of the housing allows heat to be removed directly from the slug, thereby reducing the junction temperature of the integrated circuit. The matching coefficients of thermal expansion of the heat slug, the housing and the integrated circuit substantially prevent thermal warping or bending of the package.

It is therefore an object of the present invention to provide an integrated circuit package that is thermally efficient and has a flat mounting surface.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
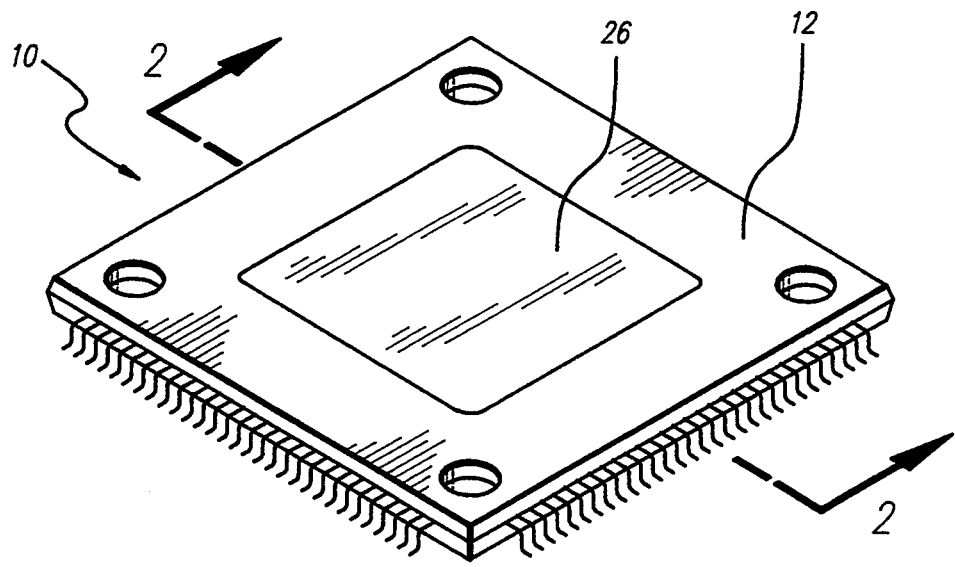
FIG. 1 is a perspective view of an integrated circuit package of the present invention.

Referring to the drawings more particularly by reference numbers, FIG. 1 shows an integrated circuit package 10 of the present invention. The package 10 includes a housing 12 which has a top surface 14, a bottom surface 16 and four side surfaces 18. Extending from the side surfaces 18 are the leads 20 of a lead frame 22. The leads 20 are typically soldered to a printed circuit board (not shown). Although "gull-wing" type leads are shown, it is to be understood that the package may have any arrangement of leads such as pogo pins that extend from the bottom surface 16 of the housing and are soldered to the printed circuit board.

Figure 2:
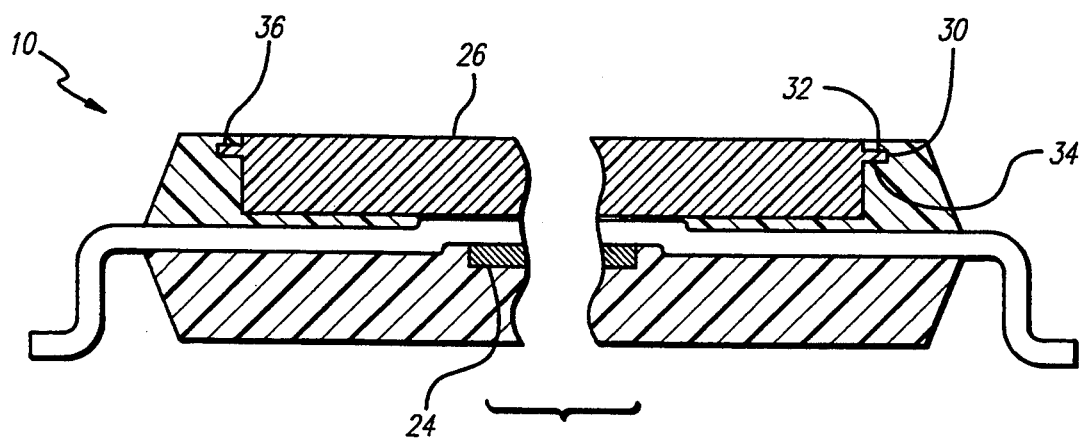
FIG. 2 is a cross-sectional view of the integrated circuit package taken at line 2—2 of FIG. 1.

As shown in FIG. 2, the package 10 includes an integrated circuit 24 that is connected to the lead frame 22 and encapsulated by the housing 12. Coupled to the integrated circuit 24 is a heat slug 26 that has a top surface 28 which extends to the top surface 14 of the housing 12. The heat slug 26 is constructed from a material that is both thermally conductive and has a coefficient of thermal expansion which matches the coefficient of thermal expansion of the housing 12 and the integrated circuit 24.

The housing 12 is typically constructed from a glass filled epoxy which has a coefficient of thermal expansion of approximately 15.0 parts per million per degrees centigrade ("ppm/°C."). The integrated circuit is typically constructed from silicon that has a coefficient of thermal expansion of approximately 3.0 ppm/°C. In the preferred embodiment, the heat slug 26 is constructed from either nickel which has a coefficient of approximately 13.0 ppm/°C., or a copper clad with molybdenum which have coefficients of 17.0 ppm/°C. and 5.0 ppm/°C., respectively, that combine to have a net coefficient of 13.0 ppm/°C., that combine to have a net coefficient of 13.0 ppm/°C. As one embodiment, the heat slug 26 may have approximately 70% copper and 30% molybdenum measured across the thickness of the slug.

The heat slug 26 provides a direct thermal path between the integrated circuit 24 and the top of the package 10, wherein the heat generated by the circuit 24 may be removed by convection from slug 26, either naturally or by an airstream created by a fan. Additionally, the top surface 28 of the heat slug 26 may be attached to a finned heat sink (not shown) which increases the effective surface area of the thermal slug.

The heat slug 26 may have an outer rim 30 that is defined by two opposite outer grooves 32 and 34. The outer rim 30 is embedded into the housing 12 and prevents the slug 26 from becoming detached from the package 10. The heat slug 26 also has a step 36 defined by outer groove 38 which compensates for the growth of the housing 12 during the curing process, so that the top surface 14 of the slug 26 is not covered by the encapsulant material of the housing.

To assemble the package 10, the lead frame 22 is first coupled to the integrated circuit 24. The heat slug 26 is then bonded to either the lead frame 22 or the circuit 24, preferably by a silver filled epoxy. The integrated circuit 24, lead frame 22 and heat slug 26 are then encapsulated by an uncured silica filled epoxy. The uncured epoxy is placed flush with the top surface of the heat slug 26, filing the step 36. The epoxy is then heated and cured to form the hard outer housing 12. The matching coefficients of thermal expansion between the epoxy, the silicon integrated circuit and the heat slug significantly reduces the warping or bending the package, when the temperature of the package is reduced from the elevated curing temperature. The lack of warping and bending provides a package which can generally meet flatness and parallelism requirements for assembly to another item such as a printed circuit board or a heat sink. What is thus provided is a integrated circuit package that is thermally efficient and has a relatively high production yield.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method of assembling a semiconductor package, comprising the steps of:
    a) coupling a lead frame to an integrated circuit;
    b) coupling a heat slug to said lead frame, said heat slug having a top surface and being constructed from a composition of 70% copper and 30% molybdenum;
    c) encapsulating said integrated circuit, a portion of said lead frame and said heat slug to essentially said top surface of said heat slug with a plastic dielectric housing material; and,
    d) heating said plastic dielectric housing material, said heat slug, said lead frame and said integrated circuit to cure said plastic dielectric housing material.

2. A method of assembling a semiconductor package, comprising the steps of:
    a) coupling a lead frame to an integrated circuit;
    b) coupling a nickel heat slug to said lead frame, said heat slug having a top surface;
    c) encapsulating said integrated circuit, a portion of said lead frame and said heat slug to essentially said top surface of said heat slug with a dielectric plastic housing material; and,
    d) heating said plastic dielectric housing material, said heat slug, said lead frame and said integrated circuit to cure said plastic dielectric housing material. said plastic dielectric housing material.

* * * * *

UNITED STATES PATENT AND TRADEMARK OFFICE
CERTIFICATE OF CORRECTION

PATENT NO.   : 5,397,746
DATED        : March 14, 1995
INVENTOR(S)  : Richard C. Blish II It is certified that error appears in the above-identified patent and that said Letters Patent is hereby corrected as shown below:

In column 4 at line 28 delete "said plastic dielectric housing material".

Signed and Sealed this

Twenty-fourth Day of December, 1996

Attest:

BRUCE LEHMAN

*Attesting Officer*    *Commissioner of Patents and Trademarks*